United States Patent
Lee et al.

(10) Patent No.: US 7,081,643 B2
(45) Date of Patent: Jul. 25, 2006

(54) GAIN-CLAMPED SEMICONDUCTOR OPTICAL AMPLIFIER HAVING HORIZONTAL LASING STRUCTURE AND MANUFACTURING METHOD THEREOF

(75) Inventors: Jeong-Seok Lee, Anyang-si (KR); Jung-Koo Kang, Suwon-si (KR); Seong-Taek Hwang, Pyeongtaek-si (KR)

(73) Assignee: Samsumg Electronics Co., Ltd., Suwon-si (KR)

( * ) Notice: Subject to any disclaimer, the term of this patent is extended or adjusted under 35 U.S.C. 154(b) by 98 days.

(21) Appl. No.: 10/781,508

(22) Filed: Feb. 18, 2004

(65) Prior Publication Data
US 2005/0040416 A1    Feb. 24, 2005

(30) Foreign Application Priority Data
Aug. 20, 2003   (KR) .................. 10-2003-0057705

(51) Int. Cl.
*H01L 29/22* (2006.01)
(52) U.S. Cl. ................. 257/98; 257/79; 257/80; 257/13; 372/50
(58) Field of Classification Search ............. 257/79, 257/98, 80, 13; 372/50
See application file for complete search history.

(56) References Cited

U.S. PATENT DOCUMENTS

| | | | |
|---|---|---|---|
| 6,330,265 B1 * | 12/2001 | Kinoshita | 372/50.12 |
| 6,661,828 B1 * | 12/2003 | Funabashi et al. | 372/96 |
| 6,885,686 B1 * | 4/2005 | Botez | 372/102 |

* cited by examiner

*Primary Examiner*—Christian D. Wilson
*Assistant Examiner*—Douglas M. Menz
(74) *Attorney, Agent, or Firm*—Cha & Reiter, LLC

(57) ABSTRACT

A gain-clamped semiconductor optical amplifier having a horizontal lasing structure in which an oscillation direction of a laser is different from an amplification direction of a signal, and a method for manufacturing the gain-clamped semiconductor optical amplifier. The gain-clamped semiconductor optical amplifier includes a gain layer for amplifying an optical signal. A Bragg lattice layer is formed on both sides of the gain layer along a longitudinal direction of the gain layer for enabling light having a corresponding wavelength to resonate in a direction vertical to the longitudinal direction of the gain layer. A passive light waveguide restrains light resonating between lattices of the Bragg lattice layer. An electrode supplies current to the gain layer, and a current-blocking layer prevents current from flowing to an area other than the gain layer.

9 Claims, 12 Drawing Sheets

GAIN-CLAMPED SEMICONDUCTOR OPTICAL AMPLIFIER HAVING HORIZONTAL LASING STRUCTURE AND MANUFACTURING METHOD THEREOF

CLAIM OF PRIORITY

This application claims priority to an application entitled "Gain-clamped semiconductor optical amplifier having horizontal lasing structure and manufacturing method thereof," filed in the Korean Intellectual Property Office on Aug. 20, 2003 and assigned Serial No. 2003-57705, the contents of which are hereby incorporated by reference.

BACKGROUND OF THE INVENTION

1. Field of the Invention

The present invention relates to an optical amplifier. More particularly, the present invention relates to a gain-clamped semiconductor optical amplifier having a horizontal lasing structure, in which an oscillation direction of a laser for gain-clamping is different than an amplification direction of a signal, and a method for manufacturing the gain-clamped semiconductor optical amplifier.

2. Description of the Related Art

In a general optical communication system, when light that is emitted from a transmitter moves along an optical transmission line, it suffers transmission losses, whereby a signal arriving at a receiver becomes reduced. When the power of light arriving at a receiver is smaller than a predetermined value, normal optical communication may be not performed due to a receiving error. Therefore, an optical amplifier is provided between a transmitter and a receiver so as to amplify light, thereby compensating for the transmission loss of the light transmitted along the optical transmission line and enabling the light to be transmitted to a farther distance with little error.

Such optical amplifiers include an erbium-doped fiber amplifier (hereinafter, referred to as EDFA), a Raman amplifier, and a semiconductor optical amplifier (hereinafter, referred to as SOA).

The EDFA, which uses an optical fiber doped with the rare-earth elements (e.g. an Erbium) for amplification, has a high gain characteristic, a low noise figure (NF), and high saturation output power, so that the EDFA has been widely used in both a backbone network and in a metro network. However, the EDFA has problems in that the price is high and an operation wavelength is limited.

A Raman amplifier, which uses Raman amplification in an optical fiber, is a method for amplifying light using a so-called Raman amplification phenomenon. According to Raman amplification, when the pumping of a strong light is incident to the optical fiber, a gain appears at a longer wavelength side distanced about 100 nm from wavelength of the pumping light due to stimulated Raman scattering. Light of the wavelength band having above gain is incident to the excited optical fiber, so that light is amplified. The Raman amplifier can easily adjust an amplification band by properly setting wavelength of the pumping light for the Raman amplification, and has a low noise figure. However, the Raman amplifier has disadvantages in that not only does it have very low optical amplification efficiency but also needs a high-priced pumping light source, thereby increasing the entire size of the optical amplifier module and the price of the optical amplifier module.

The SOA uses gain characteristics of a semiconductor and can adjust its amplification band according to a semiconductor band gap. The SOA has advantages in that it is small in size (usually a few cm) and especially does not require a high-priced pumping light source.

However, the SOA generally has a gain saturation phenomenon at low input power, and that a gain value decreases when intensity of an input signal increases. Therefore, when a signal having a large optical power is inputted, the inputted signal is distorted during signal amplification to be transmitted.

In order to solve such a problem, a gain-clamped SOA having a structure as shown in FIG. 1 has been proposed.

FIG. 1 illustrates a structure of a conventional gain-clamped semiconductor optical amplifier (gain-clamped SOA) 100. The gain-clamped SOA 100 includes an n-InP substrate 101, an InGaAsP passive waveguide layer 102, an InP spacer 103, a DBR lattice pattern 104, an active-layer waveguide 105, a current blocking layer 106, a p-InP clad layer 107, a p-InGaAs layer 108 for reducing an ohmic contact resistance, an oxide layer 109, an upper electrode 110, and a lower electrode 111.

The gain-clamped SOA 100 induces laser oscillation in a short wavelength that is outside of a wavelength range of an input signal to be amplified. The gain-clamped SOA uses distributed Bragg reflector lattices to fix the density of carriers in a resonator, so that optical gain is constantly maintained even though a driving current increases.

However, in the conventional gain-clamped SOA, one problem exists in that a first procession direction (shown as "A" in FIG. 1) of a signal is the same as a second procession direction (shown as "B" in FIG. 1) of a laser beam to induce oscillation. Therefore, when signals of several channels are amplified, a four wave mixing phenomenon is caused between the oscillation wavelength and a signal wavelength. Further, the conventional gain-clamped SOA has another problem in that a separate wavelength filter is required for removing the oscillation wavelength of the laser.

SUMMARY OF THE INVENTION

Accordingly, among its many attributes, the present invention, overcomes the above-mentioned problems. The present invention provides a gain-clamped semiconductor optical amplifier having a horizontal lasing structure in which an oscillation direction of a laser is different from an amplification direction of a signal, and a method for manufacturing the gain-clamped semiconductor optical amplifier In order to accomplish the aforementioned objects, according to a first aspect of the present invention, there is provided a gain-clamped semiconductor optical amplifier having a horizontal lasing structure comprising: a gain layer for amplifying an optical signal; a Bragg lattice layer formed on both sides of the gain layer along a longitudinal direction of the gain layer for enabling light having a corresponding wavelength to resonate in a direction vertical to the longitudinal direction of the gain layer; a passive light waveguide layer for restraining light resonating between lattices of the Bragg lattice layer; an electrode for supplying current to the gain layer; and a current-blocking layer for preventing current from flowing to an area other than the gain layer.

Preferably, the passive light waveguide layer is formed above or below the Bragg lattice layer.

More preferably, the gain-clamped semiconductor optical amplifier further comprises a phase conversion area formed at one side of the Bragg lattice layer and a phase conversion electrode for supplying current to the phase conversion area.

In order to accomplish the aforementioned objects, according to an embodiment of the present, there is provided a method for manufacturing a gain-clamped semiconductor optical amplifier having a horizontal lasing structure comprising the steps of: a) forming a Bragg lattice layer on a first conductive semiconductor substrate other than a predetermined gain layer forming area; b) forming a first conductive lower clad layer, a light waveguide layer, and a first conductive upper clad layer on the first conductive semiconductor substrate having the Bragg lattice layer thereon; c) forming a gain layer and a second conductive clad layer on the first conductive upper clad layer of the predetermined gain layer forming area; d) forming a current-blocking layer on a predetermined area of the first conductive upper clad layer, on which the gain layer is not formed; and e) forming an electrode above the second conductive clad layer and a predetermined area of the first conductive upper clad layer, on which the current-blocking layer is not formed, in such a manner that the electrode surrounds the gain layer.

In order to accomplish the aforementioned aspects of the present invention, there is provided a method for manufacturing a gain-clamped semiconductor optical amplifier having a horizontal lasing structure, the method comprising the steps of: a) forming a gain material layer and a second conductive lower clad layer on a first conductive semiconductor substrate; b) forming a mask pattern on the second conductive lower clad layer of a predetermined gain layer forming area, forming a gain layer having a mesa structure through a selective etching process using the mask pattern as an etching mask, and forming an etching groove in the first conductive semiconductor substrate corresponding to a side wall of the gain layer; c) forming a current-blocking layer on the etching groove; d) forming a light waveguide layer including a material having a refractive index higher than that of the first conductive semiconductor substrate, on the current-blocking layer; e) forming a Bragg lattice layer on the light waveguide layer; f) forming a second conductive upper clad layer on an entire surface of the Bragg lattice layer and the gain layer; and g) forming an electrode on the second conductive upper clad layer for supplying current to the gain layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
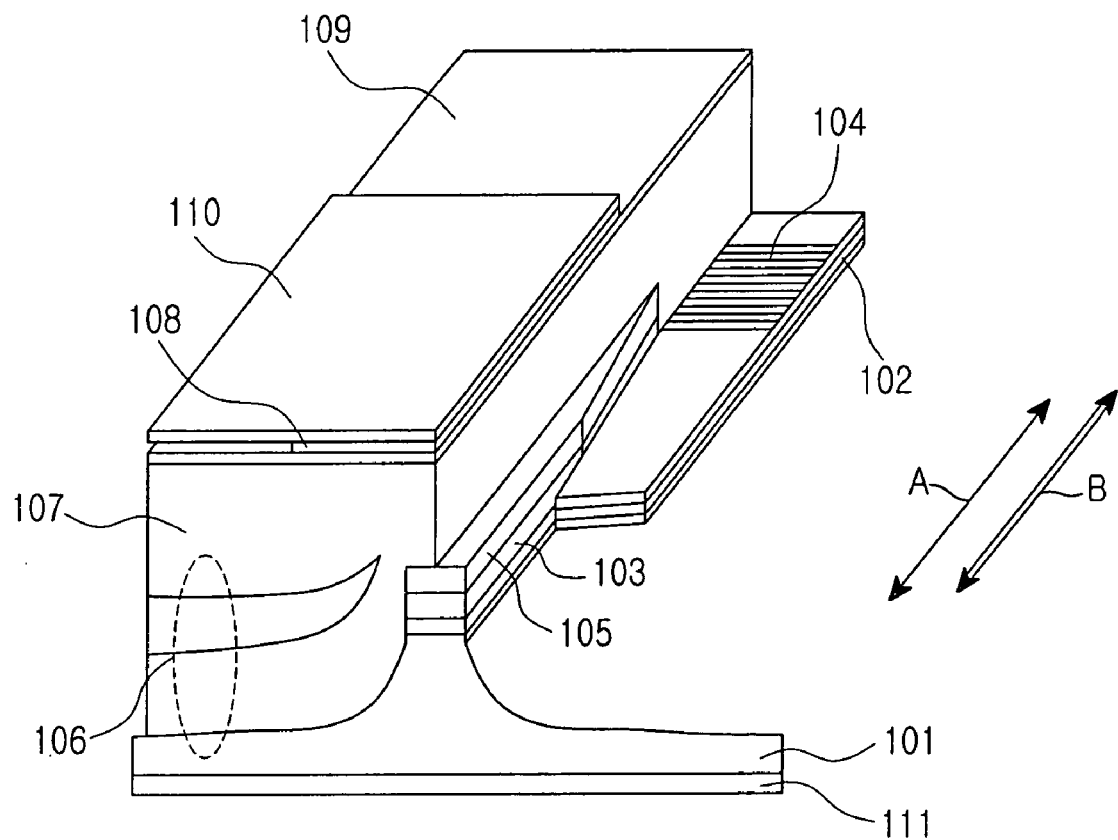
FIG. 1 is a schematic view showing a structure of a conventional gain-clamped semiconductor optical amplifier.

Hereinafter, according to the present invention will be described with reference to the accompanying drawings. The same reference numerals are used to designate the same elements as those shown in other drawings. In the following description of the present invention, a detailed description of known functions and configuration incorporated herein will be omitted when it may obscure the subject matter of the present invention.

Figure 2:
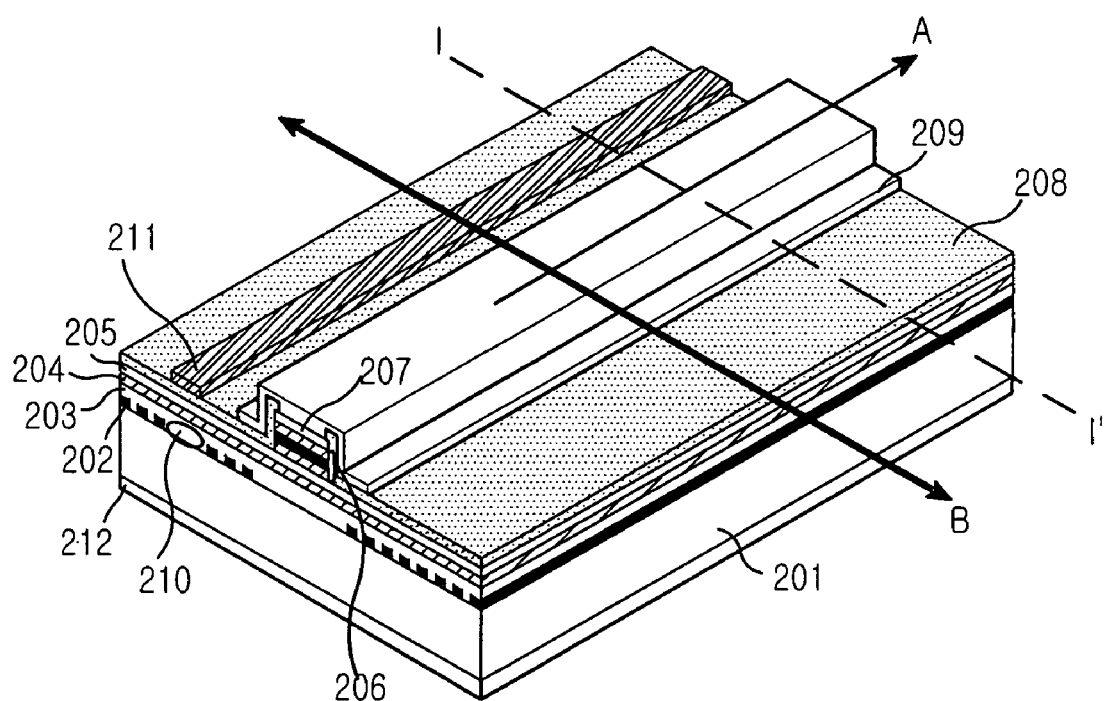
FIG. 2 is a view showing a construction of a gain-clamped semiconductor optical amplifier having a horizontal lasing structure according to an aspect of the present invention.
Figure 3:
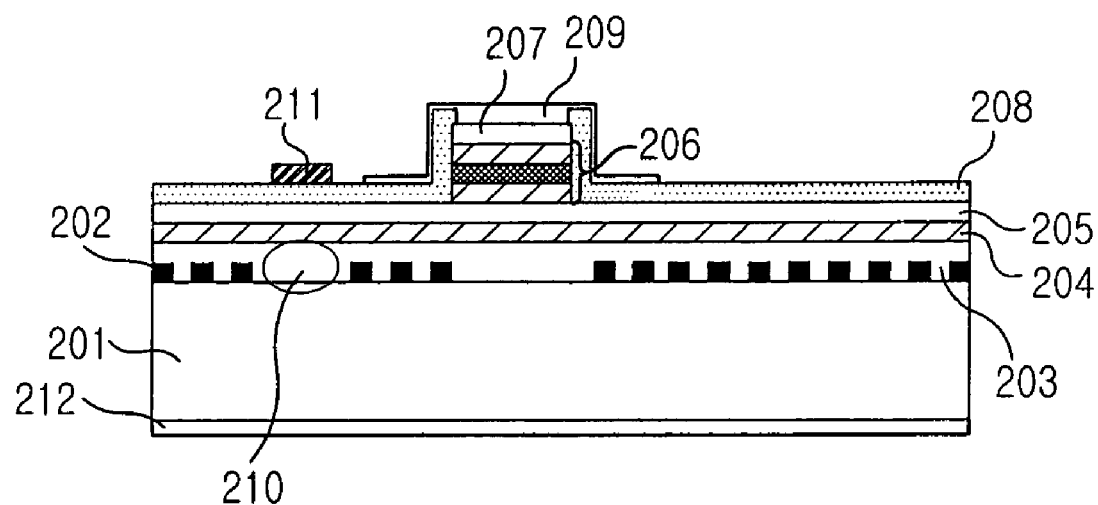
FIG. 3 is a cross-sectional view taken along line I—I in FIG. 2.

FIG. 2 is a view showing a construction of a gain-clamped semiconductor optical amplifier 200 having a horizontal lasing structure according to an aspect of the present invention, and FIG. 3 is a cross-sectional view taken along line I—I' in FIG. 2. The gain-clamped semiconductor optical amplifier 200 (hereinafter, referred to as a gain-clamped SOA) includes a semiconductor substrate 201, a Bragg lattice layer 202, an n-InP lower clad layer 203, a passive light waveguide layer 204, an n-InP upper clad layer 205, a gain layer 206, a p-InP clad layer 207, a current-blocking layer 208, an electrode 209. In addition, the SOA 200 includes a phase conversion area 210 and a phase conversion electrode 211.

The Bragg lattice layer 202 enables light having a corresponding wavelength to resonate between the Bragg lattices of the Bragg lattice layer 202, so that a Bragg laser oscillation is generated in a horizontal direction. The Bragg lattice layer 202 is formed above or below the passive light waveguide layer 204. In this particular case, the Bragg lattice layer 202 is formed below the passive light waveguide layer 204, but a person of ordinary skill in the art understands that the Bragg lattice layer could be formed above the passive light waveguide layer.

In order to restrict the optical loss of modes resonated by Bragg lattices formed at both sides of the Bragg lattice layer 202 and to efficiently perform a Bragg reflection, the passive light waveguide layer 204 provides a high optical confinement coefficient between the Bragg lattice layer 202 and the gain layer 206 and has a refractive index greater than that of the semiconductor substrate 201.

The gain layer 206 amplifies an input optical signal and is formed on a portion of the n-InP upper clad layer 205 below which the Bragg lattice layer 202 is not formed. The p-InP clad layer 207 is formed on the gain layer 206.

The current-blocking layer 208 prevents current from flowing to an area other than the gain layer 206, thereby improving current efficiency of the gain layer 206. Such a current-blocking layer 208 is formed in a peripheral area of the gain layer 206 and a portion of the n-InP upper clad layer 205 except for the phase conversion area 210.

The electrode 209 supplies current to the gain layer 206 and is formed on a wide area of the n-InP upper clad layer 205 so that conductive wires can be easily connected when a module is manufactured.

The phase conversion area 210 adjusts critical current of a laser by a lasing wavelength adjustment, thereby adjusting a gain value of the gain-clamped SOA 200. The phase conversion area 210 can be achieved by omitting Bragg lattices from a predetermined portion of the Bragg lattice layer 202. That is, the change of the phase by applying the bias depends on the waveguide structure and the length of the phase section. Thus, in order to increase the phase conversion, more Bragg lattices have to be omitted.

The phase conversion electrode 211 can change the oscillation wavelength of the laser by changing current or voltage applied to the phase conversion area 210. The phase conversion electrode 211 is formed above the current-blocking layer 208 of the phase conversion area 210, or the n-InP upper clad layer 205. When the oscillation wavelength of the laser changes, driving current and electric charge density required for oscillation change because a gain curve of a gain area is differently formed depending on wavelengths. As a result, the gain value of the gain-clamped SOA 200 changes in a wavelength range to be amplified.

Hereinafter, an operation of the gain-clamped SOA 200 having the horizontal lasing structure will be described. Referring to FIGS. 2 and 3, when pumping current is injected into the gain layer 206, spontaneous emission causing transition from a first conduction band of a higher energy level to a second conduction band of a lower energy level are generated, and so that stimulated emission occurs due to transition to a valence band of a lower energy level. A part of the light generated by the spontaneous emission from the gain layer 206 is restrained in the passive light waveguide layer 204. A specific wavelength of the restrained light satisfying a resonance condition of the Bragg lattice is repeatedly feedback through a resonance interval formed between the passive optical waveguide layer 204 and the gain layer 206 and both sides of the gain layer 206. Whenever feedback occurs once, light having the predetermined wavelength passes the gain layer 206 twice to obtain a gain by the stimulated emission is generated due to the density inversion (or population inversion). The gain of the gain layer 206 is proportional to an increase of current, so that the optical gain is greater than optical loss due to one feedback in a horizontal direction, and an oscillation occurs. When the generation of such oscillation begins, charge density of the gain layer is clamped, so that gain-clamping characteristic, in which a gain of a device is not further increased even though driving current increases, occurs. When current continuously increases over oscillation current, the gain is not increased, but only optical intensity of the oscillation wavelength may continuously increase. At this time, light is amplified in a longitudinal direction "A" of the gain layer 206, and oscillation of the laser occurs in a horizontal direction "B".

FIGS. 4a to 4e are views illustrating a manufacturing processes of the ridge type the gain-clamped SOA shown in FIG. 2.

Figure 4A:
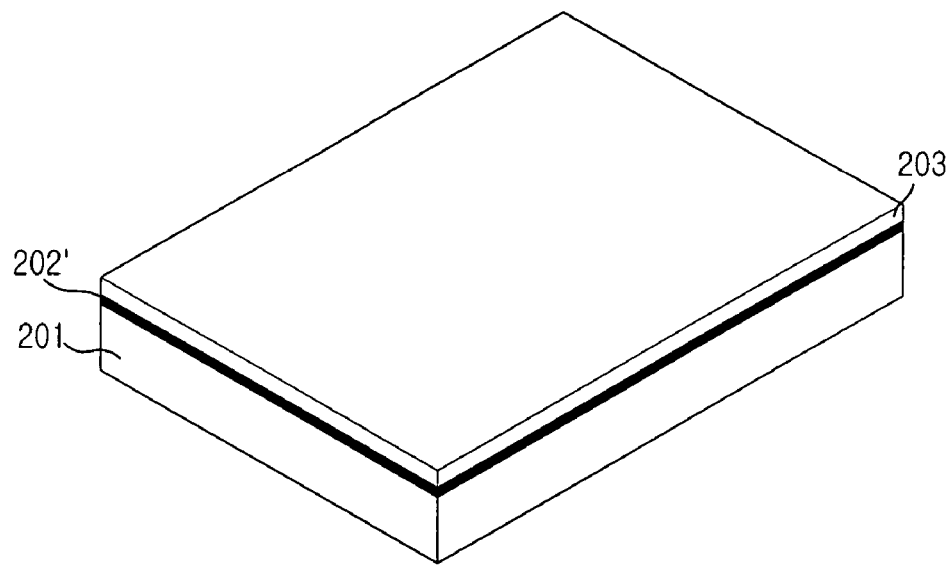
FIGS. 4a to 4e are views illustrating manufacturing processes of a ridge type a gain-clamped semiconductor optical amplifier having a horizontal lasing structure according to an aspect of the present invention.

First, as shown in FIG. 4a, a material layer 202' of material having a refractive index different from that of the n-InP substrate 201 and the n-InP lower clad layer 203 are formed on the n-InP substrate 201 so as to form the Bragg lattices on the n-InP substrate 201.

Figure 4B:
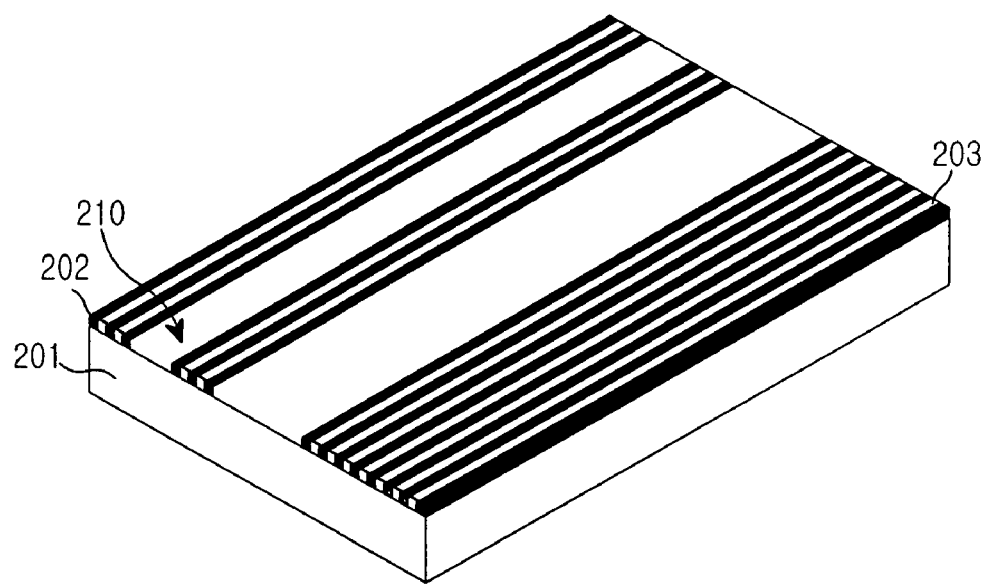
Figure 4C:
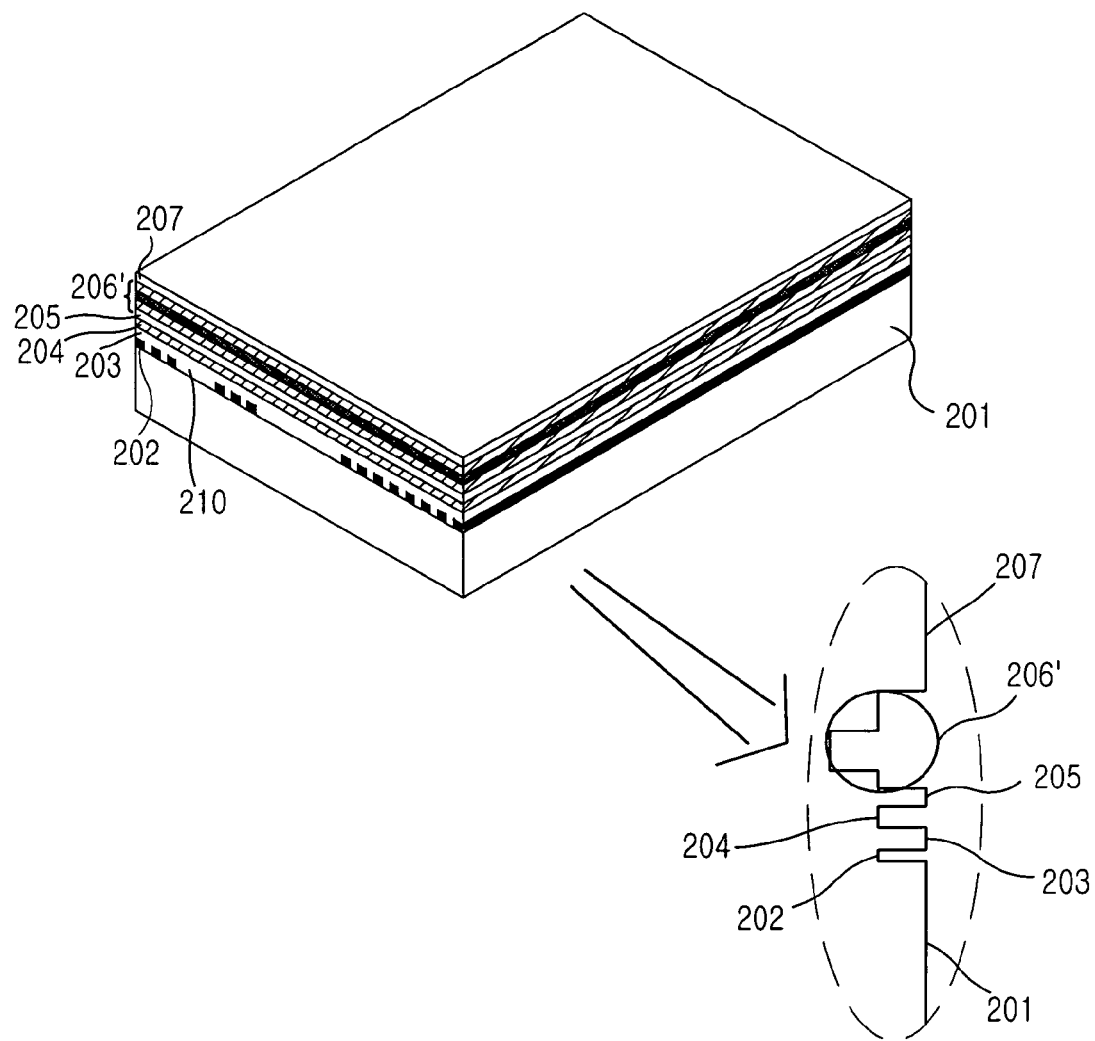

In FIG. 4b, the Bragg lattice layer 202 is formed on the n-InP substrate 201 except for a predetermined gain layer forming area and the phase conversion area 210 through a selective etching method. At this stage of the manufacturing process, without yet forming the phase conversion area 210, the Bragg lattice layer 202 may be formed on the n-InP substrate 201 except for the gain layer forming area. The Bragg lattice layer 202 can be formed in a conventional manner, unless one considers the quantity and arrangement of lattices used in the present invention. In FIG. 4c, the n-InP lower clad layer 203, the passive light waveguide layer 204, the n-InP upper clad layer 205, a gain material layer 206', the p-InP clad layer 207 sequentially grow on the Bragg lattice layer 202 and the n-InP lower clad layer 203, which were previously formed. The gain material layer 206' grows as a bulk structure or a quantum well structure, and an amplification band can be adjusted by adjusting a composition ratio of material forming the gain layer or thickness of the gain layer 206 according to wavelength of an inputted optical signal. In FIG. 4c, a step-shape graph in a dotted circle represents band gaps of the composition material layers 201 to 207. At this time, the Bragg lattice layer 202 can be formed above or below the passive light waveguide layer 204. According to this particular illustration, the Bragg lattice layer 202 is formed below the passive light waveguide layer 204. Also, although it is not shown, it is possible to add an etching stopping layer forming step to form a ridge type waveguide.

Figure 4D:
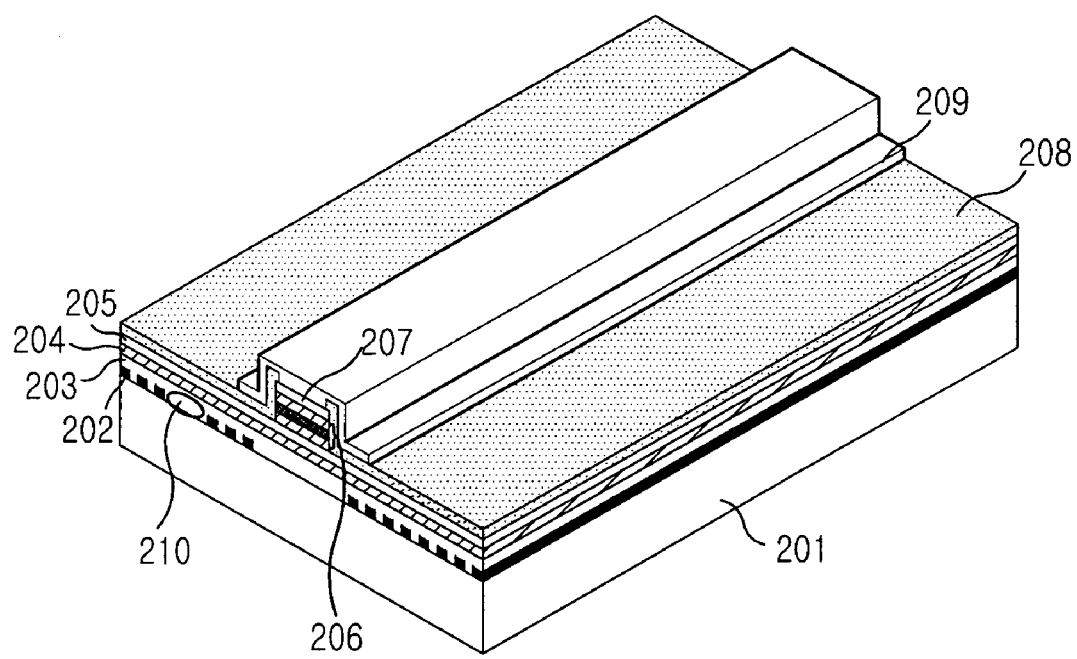

Referring to FIG. 4d, the gain layer 206 is formed by selectively etching the gain material layer 206' through an etching process using an SiO2 mask or an SiNx mask. After the selective etching process is completed, the $SiO_2$ or $SiN_x$ current-blocking layer 208 is formed on the entire structure. Next, a photo mask process and an etching process are performed to expose the gain area into which current is injected. After that, the electrode 209 is formed.

Figure 4E:
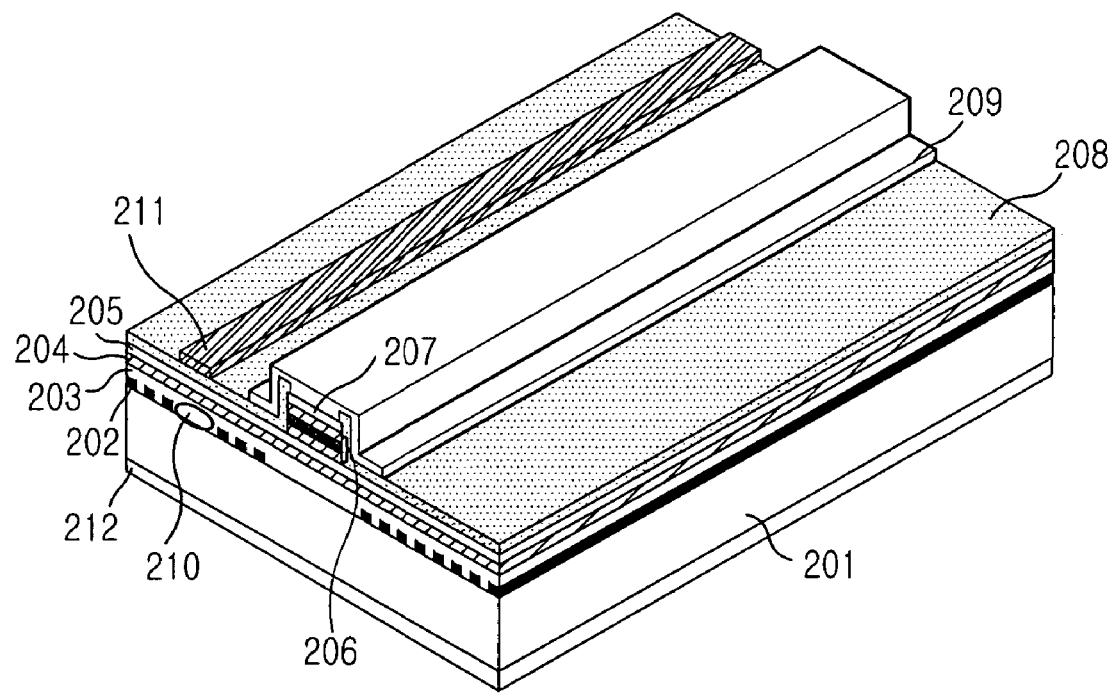

As shown in FIG. 4e, the phase conversion electrode 211 is formed on the current-blocking layer 208 corresponding to the phase conversion area 210. In addition, an electrode 212 is formed on the underside of the n-InP substrate 201.

Meanwhile, the gain-clamped SOA having the horizontal lasing structure according to the present invention may be also achieved as a buried hetero-structure, in addition to the ridge-type the gain-clamped SOA 200 in FIG. 2.

Figure 5:
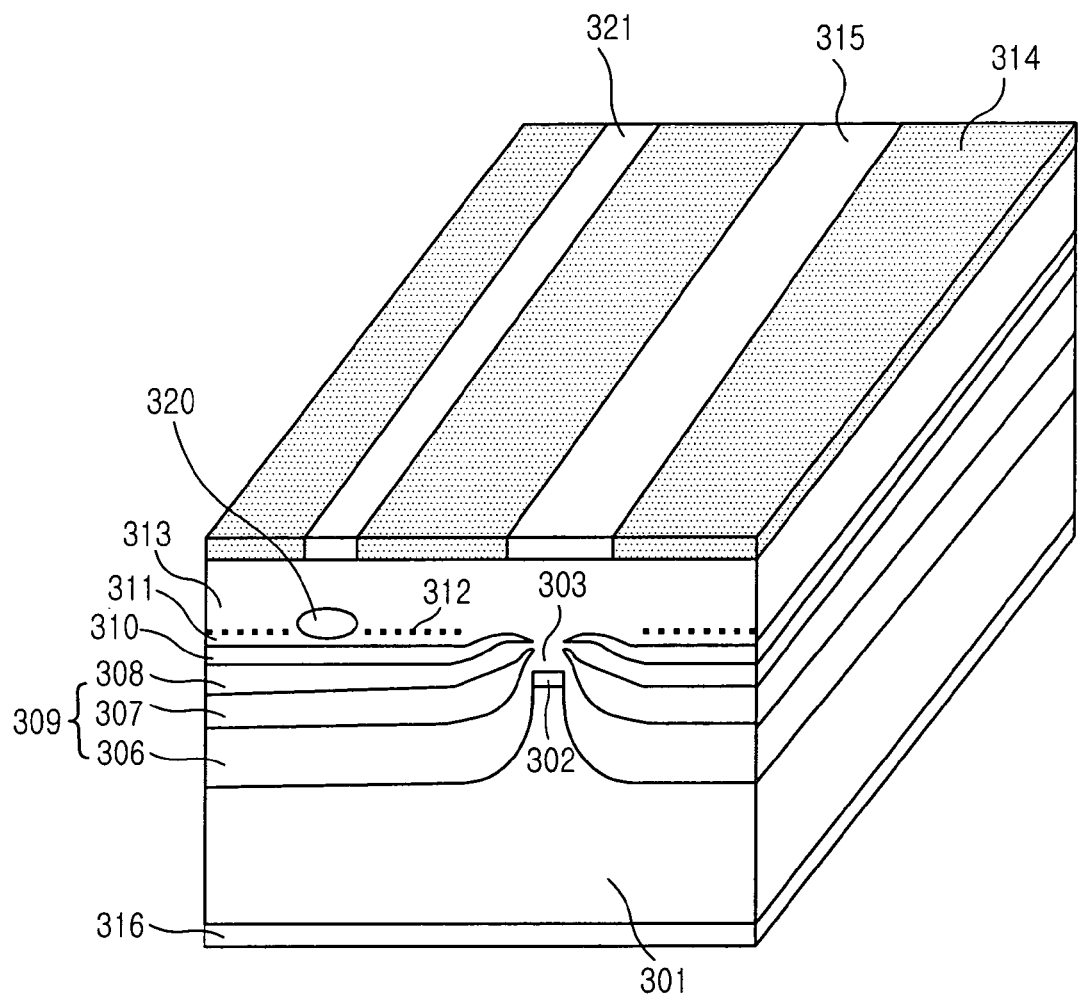
FIG. 5 is a view showing a construction of a buried hetero-structure of a gain-clamped semiconductor optical amplifier having a horizontal lasing structure according to another aspect of the present invention.

FIG. 5 illustrates the construction of a buried hetero-structure of a gain-clamped semiconductor optical amplifier 300 having a horizontal lasing structure according to another aspect of the present invention.

Referring to FIG. 5, the gain-clamped semiconductor optical amplifier 300 (hereinafter, referred to as a gain-clamped SOA) includes a semiconductor substrate 301, a gain layer 302, an p-InP upper clad layer 303, a current-blocking layer 309, a light waveguide layer 310, an p-InP upper clad layer 311, a Bragg lattice layer 312, an p-InP upper clad layer 313, an insulation layer 314, electrodes 315 and 316. In addition, the SOA 300 includes a phase conversion area 320 and a phase conversion electrode 321 formed on the phase conversion area 320.

The operation of the gain-clamped SOA 300 having the horizontal lasing structure of a buried hetero-structure is similar to that of the ridge-type the gain-clamped SOA 200 in FIG. 2, so a detailed description of that will be omitted below.

FIGS. 6a to 6e are views illustrating a manufacturing processes of the gain-clamped SOA 300 having the buried hetero-structure in FIG. 5.

Figure 6A:
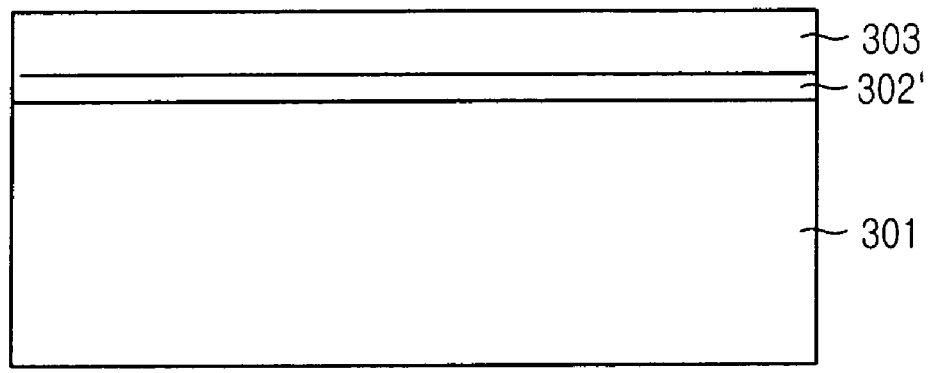
FIGS. 6a to 6e are views illustrating manufacturing processes of a buried hetero-structure of a gain-clamped semiconductor optical amplifier having a horizontal lasing structure according to yet another aspect of the present invention.

First, as shown in FIG. 6a, a gain material layer 302' and the p-InP clad layer 303 grow on the n-InP substrate 301.

Figure 6B:
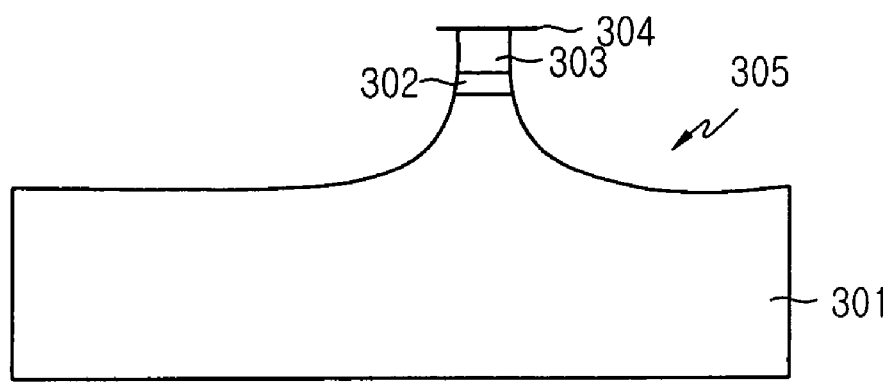

In FIG. 6b, a mask pattern 304 is formed on the p-InP clad layer 303 corresponding to a predetermined gain layer forming area through an etching process using an SiO2 or an SiNx mask. Next, the gain layer 302 having a mesa structure and an etching groove 305 are formed by selectively removing the p-InP clad layer 303, the gain material layer 302', and the n-InP substrate 301 through an etching process using the mask pattern 304 as an etching mask.

Figure 6C:
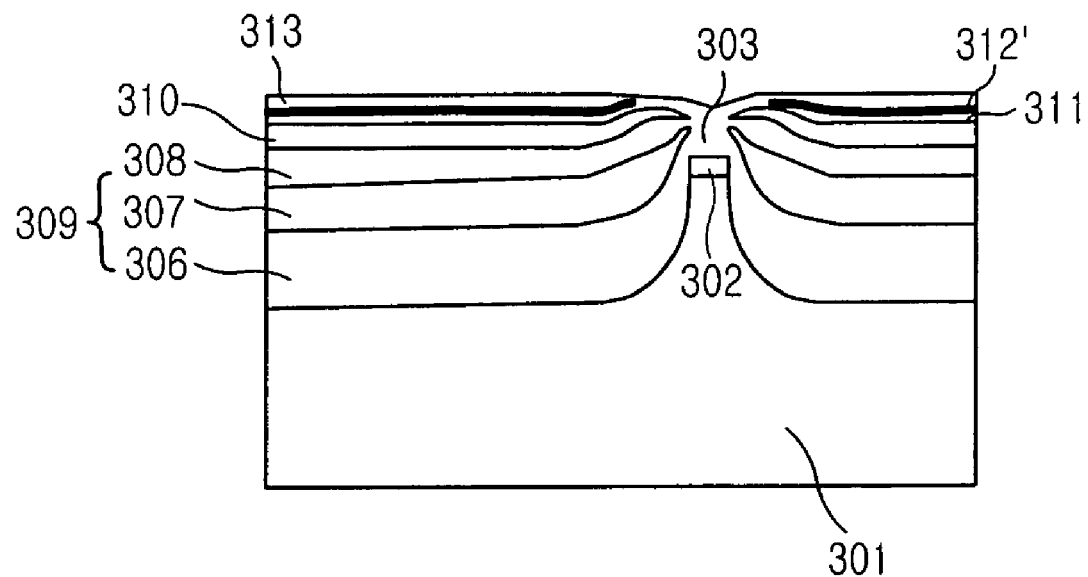

In FIG. 6c, the current-blocking layer 309 including a p-InP layer 306, an n-InP layer 307, and a p-InP layer 308 is formed at the etching groove 305. Next, the light waveguide layer 310 including a material having a refractive index higher than that of the n-InP substrate 301 is formed on the current-blocking layer 309. Next, a thin p-InP layer 311, a material layer 312' having a refractive index higher than that of an InP, and a thin p-InP layer 313 are formed. At this time, it is preferred that a gap between the gain layer 302 and the light waveguide layer 310 is within 2 um for an optical coupling of a mode between the gain layer 302 and the light waveguide layer 310.

Figure 6D:
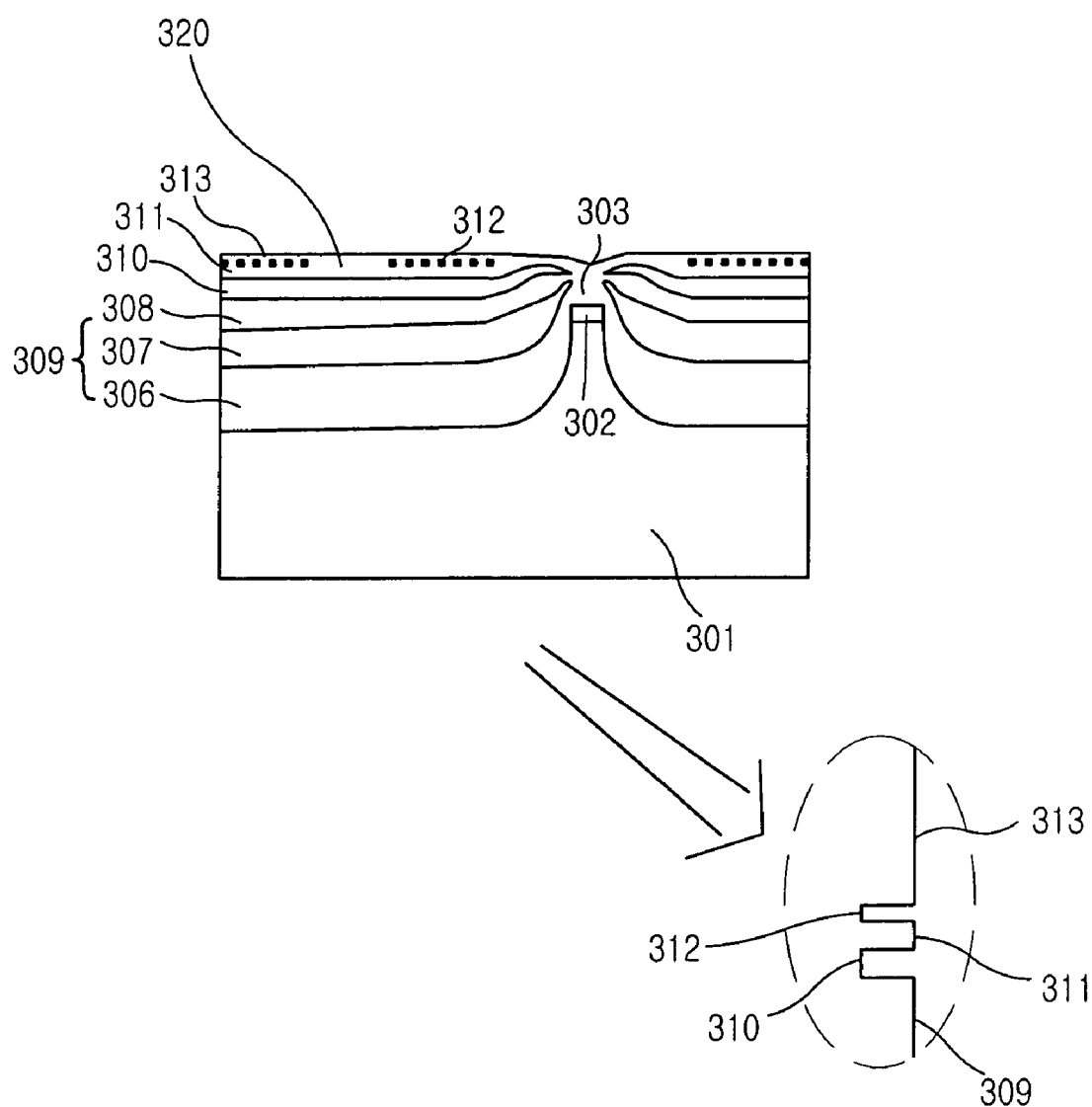

In FIG. 6d, the Bragg lattice 312 is formed on an area except for the phase conversion area 320. Similarly to the previous embodiment described above, the Bragg lattice 312 can be formed above or below the light waveguide layer 310. According to this particular illustration, the Bragg lattice 312 is formed above the light waveguide layer 310 (but it could be below the light waveguide layer 310). Also, the phase conversion area 320 may not be formed if necessary, and a method of forming the Bragg lattice 312 is equal to a conventional method used for a general wavelength feedback laser. In FIG. 6d, a step-shape graph in a dotted circle represents band gaps of the current-blocking layer 309, the light waveguide layer 310, the p-InP clad layer 311, the Bragg lattice 312, and the p-InP clad layer 313.

Figure 6E:
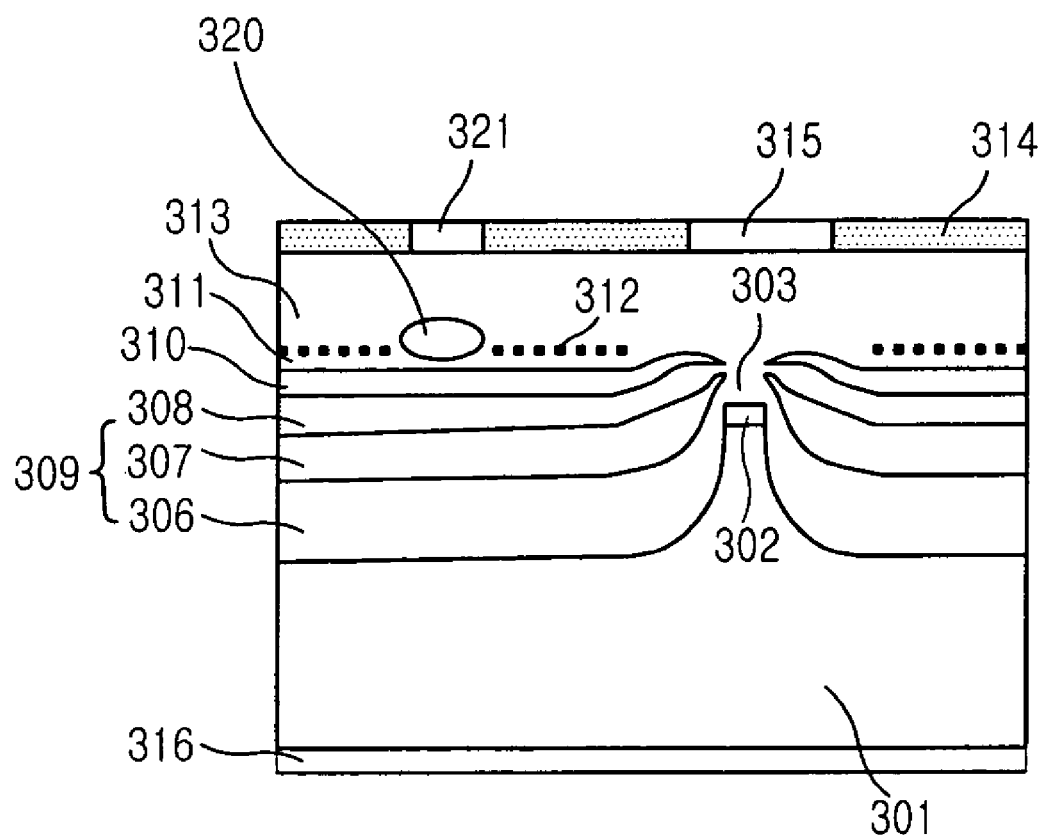

Referring to FIG. 6e, in a state constructed as described above, the p-InP clad layer 313 is formed again, and the $SiO_2$ or $SiN_x$ insulating layer 314 is deposited on the p-InP clad layer 313. Then, after a photo mask process and an etching process to expose an area into which current is injected, and the electrode 315 is formed. In addition, the electrode 321 for applying current to the phase conversion area 320 is formed, and the electrode 316 is formed on the underside of the n-InP substrate 301. At this stage of the manufacturing process, the electrode 315 for supplying current to the gain layer 302 and the phase conversion electrode 321 for supplying current to the phase conversion area 320 are separately formed.

As described above, according to the gain-clamped semiconductor optical amplifier having the horizontal lasing structure, the oscillation direction of the laser is different from the amplification direction of the signal (for example, see the direction of "A" and "B" in FIG. 2. Accordingly, it is not necessary to have a separate filter for removing a laser wavelength used for gain clamping. Further, the oscillation wavelength of the laser is shifted due to variation of current or voltage applied to a phase converter, so that the clamped gain of the semiconductor optical amplifier can be adjusted.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A gain-clamped semiconductor optical amplifier having a horizontal lasing structure, the gain-clamped semiconductor optical amplifier comprising:
   a gain layer for amplifying an optical signal;
   a Bragg lattice layer former on both sides of the gain layer along a longitudinal direction of the gain layer, said Bragg layer enabling light having a corresponding wavelength to resonate in a direction vertical to a longitudinal direction of the gain layer;
   a passive light waveguide layer for restraining light resonating between lattices of the Brass lattice layer;
   an electrode for supplying current to the gain layer; and
   a current-blocking layer for preventing current from flowing to an area other than the gain layer.

2. The gain-clamped semiconductor optical amplifier as claimed in claim 1, wherein the passive light waveguide layer is formed above the Bragg lattice layer.

3. The gain-clamped semiconductor optical amplifier as claimed in claim 1, wherein the passive light waveguide layer is formed below the Bragg lattice layer.

4. The gain-clamped semiconductor optical amplifier as claimed in claim 1, further comprising a phase conversion area formed at one side of the Bragg lattice layer.

5. The gain-clamped semiconductor optical amplifier as claimed in claim 1, wherein the phase conversion area is adjusted by omitting a predetermined portion of the Bragg lattices from the Bragg layer.

6. The gain-clamped semiconductor optical amplifier as claimed in claim 4, further comprising a phase conversion electrode for supplying current to the phase conversion area.

7. The gain-clamped semiconductor optical amplifier as claimed in claim 5, further comprising a phase conversion electrode for supplying current to the phase conversion area.

8. The gain-clamped semiconductor optical amplifier as claimed in claim 1, wherein the gain-clamped semiconductor optical amplifier includes a ridge type gain-clamped semiconductor optical amplifier.

9. The gain-clamped semiconductor optical amplifier as claimed in claim 1, wherein the gain-clamped semiconductor optical amplifier has a buried hetero-structure.

* * * * *

UNITED STATES PATENT AND TRADEMARK OFFICE
CERTIFICATE OF CORRECTION

PATENT NO.         : 7,081,643 B2
APPLICATION NO. : 10/781508
DATED              : July 25, 2006
INVENTOR(S)        : Jeong-Seok Lee et al.

It is certified that error appears in the above-identified patent and that said Letters Patent is hereby corrected as shown below:

Title page
Item [73], Assignee, should read as follows:

--Samsung Electronics Co., Ltd.--

Signed and Sealed this

Sixteenth Day of January, 2007

JON W. DUDAS
*Director of the United States Patent and Trademark Office*